US012681109B2

(12) United States Patent
Sasaki et al.

(10) Patent No.: US 12,681,109 B2
(45) Date of Patent: Jul. 14, 2026

(54) INSPECTION APPARATUS AND INSPECTION METHOD

(71) Applicant: TOKYO WELD CO., LTD., Tokyo-to (JP)

(72) Inventors: Shunsuke Sasaki, Tokyo-to (JP); Taiyo Komori, Tokyo-to (JP); Yoshikazu Sasaoka, Tokyo-to (JP)

(73) Assignee: TOKYO WELD CO., LTD., Tokyo-To (JP)

( * ) Notice: Subject to any disclaimer, the term of this patent is extended or adjusted under 35 U.S.C. 154(b) by 147 days.

(21) Appl. No.: 18/736,022

(22) Filed: Jun. 6, 2024

(65) Prior Publication Data

US 2024/0410960 A1 Dec. 12, 2024

(30) Foreign Application Priority Data

Jun. 7, 2023 (JP) ................................. 2023-094077

(51) Int. Cl.
*G01R 31/64* (2020.01)
*H02J 7/80* (2026.01)

(52) U.S. Cl.
CPC ................ *G01R 31/64* (2020.01); *H02J 7/80* (2026.01); *H02J 2207/50* (2020.01)

(58) Field of Classification Search
CPC ........ G01R 31/64; G01R 31/016; G01R 1/28; G01R 31/129; G01R 31/52; G01R 19/0092; G01R 19/25; H02J 7/0047; H02J 2207/50; H01G 4/30
USPC ........................................ 324/548, 537, 500
See application file for complete search history.

(56) References Cited

U.S. PATENT DOCUMENTS

| | | | |
|---|---|---|---|
| 11,719,759 B2 * | 8/2023 | Reitz ...................... | G01R 31/52 |
| | | | 324/555 |
| 2002/0060571 A1 | 5/2002 | Nishioka et al. | |
| 2012/0153965 A1 * | 6/2012 | Huang ................... | G01R 31/64 |
| | | | 324/548 |
| 2021/0025941 A1 * | 1/2021 | Shimazaki ............. | G01R 31/54 |
| 2022/0357411 A1 * | 11/2022 | Reitz ...................... | G01R 31/52 |
| 2022/0376601 A1 * | 11/2022 | Kapaun ............... | H02M 1/0009 |

FOREIGN PATENT DOCUMENTS

| | | |
|---|---|---|
| JP | 8-227826 A | 9/1996 |
| JP | 9-152455 A | 6/1997 |
| JP | 11-211777 A | 8/1999 |
| JP | 2000-228337 A | 8/2000 |
| JP | 2019-132633 A | 8/2019 |
| JP | 2020-64975 A | 4/2020 |
| JP | 2023-5282 A | 1/2023 |

OTHER PUBLICATIONS

Japanese Office Action for Japanese Application No. 2023-094077, dated Jul. 23, 2024 with English translation.

* cited by examiner

*Primary Examiner* — Giovanni Astacio-Oquendo
(74) *Attorney, Agent, or Firm* — Birch, Stewart, Kolasch & Birch, LLP

(57) ABSTRACT

An inspection apparatus includes: a voltage application unit that applies voltage to a capacitor to perform charging; a current measurement unit that continuously measures current of the capacitor during the charging; and an anomaly detection unit that detects an anomaly of the capacitor based on a regression line derived from a logarithm of a measured value of the current in a determination time range during the charging and a logarithm of measurement timing of the current.

6 Claims, 7 Drawing Sheets

INSPECTION APPARATUS AND INSPECTION METHOD

CROSS-REFERENCE TO RELATED APPLICATIONS

This application is based upon and claims the benefit of priority from Japanese Patent Application No. 2023-094077, filed on Jun. 7, 2023; the entire contents of which are incorporated herein by reference.

TECHNICAL FIELD

The present disclosure relates to an inspection apparatus and an inspection method for detecting a capacitor anomaly.

BACKGROUND ART

Capacitors, such as MLCCs (Multi-Layer Ceramic Capacitors), and electronic components equipped with capacitors are usually shipped after being inspected to detect defective products. In particular, in recent years, a large number of MLCCs are used in devices that require a high level of capability and safety, such as motor vehicles and telecommunications devices, and it is desired to conduct inspections to guarantee the reliability of a large number of MLCCs at a higher level.

With respect to such inspections, Japanese patent application publication No. 9-152455, for example, discloses a defect detection device for the purpose of performing determination and screening of internal defects, such as foreign matter inclusion and pinholes, in a multilayer ceramic capacitor in a short time. Further, Japanese patent application publication No. 2000-228337 discloses a quality determination method for the purpose of determining whether a capacitor is good or bad in a short time.

SUMMARY OF THE INVENTION

An object of the present disclosure is to provide a technique advantageous for detecting a capacitor anomaly with high accuracy.

One aspect of the present disclosure is directed to an inspection apparatus comprising: a voltage application unit that applies voltage to a capacitor to perform charging; a current measurement unit that continuously measures current of the capacitor during the charging; and an anomaly detection unit that detects an anomaly of the capacitor based on a regression line derived from a logarithm of a measured value of the current in a determination time range during the charging and a logarithm of measurement timing of the current.

The anomaly detection unit may detect an anomaly of the capacitor based on degree of agreement of the logarithm of a measured value of the current and the logarithm of measurement timing of the current with respect to the regression line.

The anomaly detection unit may detect an anomaly of the capacitor based on a relation of the logarithm of a measured value of the current with respect to at least one of an upper limit and a lower limit of a current tolerance range defined according to the regression line over the determination time range.

The anomaly detection unit may detects an anomaly of the capacitor based on a first regression line derived from the logarithm of a measured value of the current and the logarithm of measurement timing of the current in a first determination time range during the charging, and may detect an anomaly of the capacitor based on a second regression line derived from the logarithm of a measured value of the current and the logarithm of measurement timing of the current in a second determination time range during the charging.

The voltage application unit may apply voltage to the capacitor in a first polarity to perform first polarity charging, and may apply voltage to the capacitor in a second polarity being an opposite polarity to the first polarity, after the first polarity charging to perform second polarity charging; the current measurement unit may measure a first polarity current that is a current of the capacitor during the first polarity charging, and may measure a second polarity current that is a current of the capacitor during the second polarity charging; and the anomaly detection unit may detect an anomaly of the capacitor based on a first polarity regression line derived from a logarithm of a measured value of the first polarity current in a first determination time range during the first polarity charging and a logarithm of measurement timing of the first polarity current, and may detect an anomaly of the capacitor based on a second polarity regression line derived from a logarithm of a measured value of the second polarity current in a second determination time range during the second polarity charging and a logarithm of measurement timing of the second polarity current.

Another aspect of the present disclosure is directed to an inspection method comprising the steps of: applying voltage to a capacitor to perform charging; measuring current of the capacitor continuously during the charging; and detecting an anomaly of the capacitor based on a regression line derived from the logarithm of a measured value of the current and the logarithm of measurement timing of the current in a determination time range during the charging.

According to the present disclosure, it is possible to advantageously detect a capacitor anomaly with high accuracy.

DETAILED DESCRIPTION

Exemplary embodiments of the present disclosure are described below with reference to the drawings.

In the following description, electronic components W to be inspected may be capacitors themselves or electronic components that include capacitors as components. Further, the specific types of capacitors to be inspected are not limited, and the following techniques can be applied also to MLCCs, tantalum capacitors, and other commonly used capacitors.

[Inspection Systems]

Figure 1A:
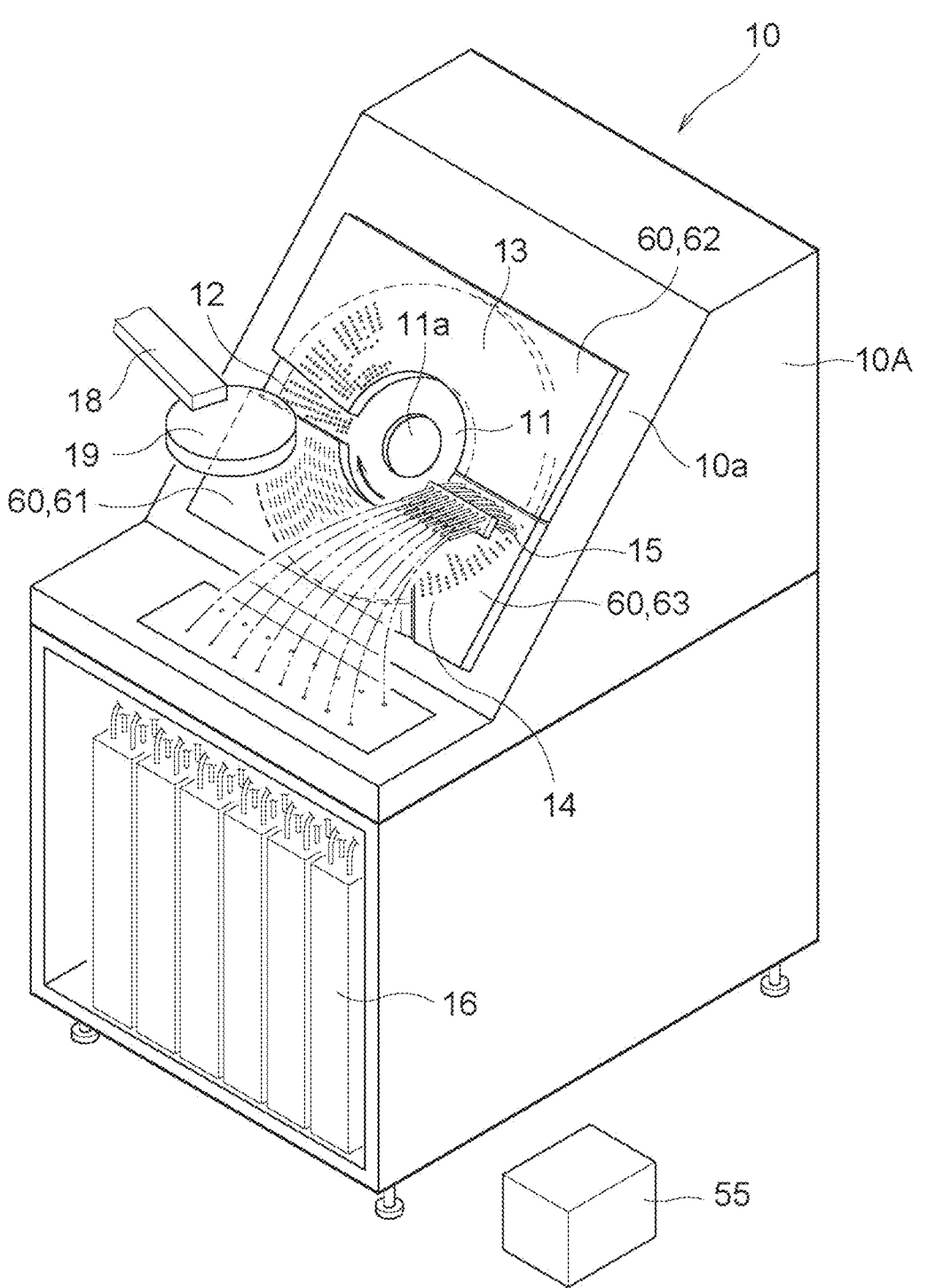
FIG. 1A is an oblique perspective view schematically showing an example of an inspection system for electronic components.
Figure 1B:
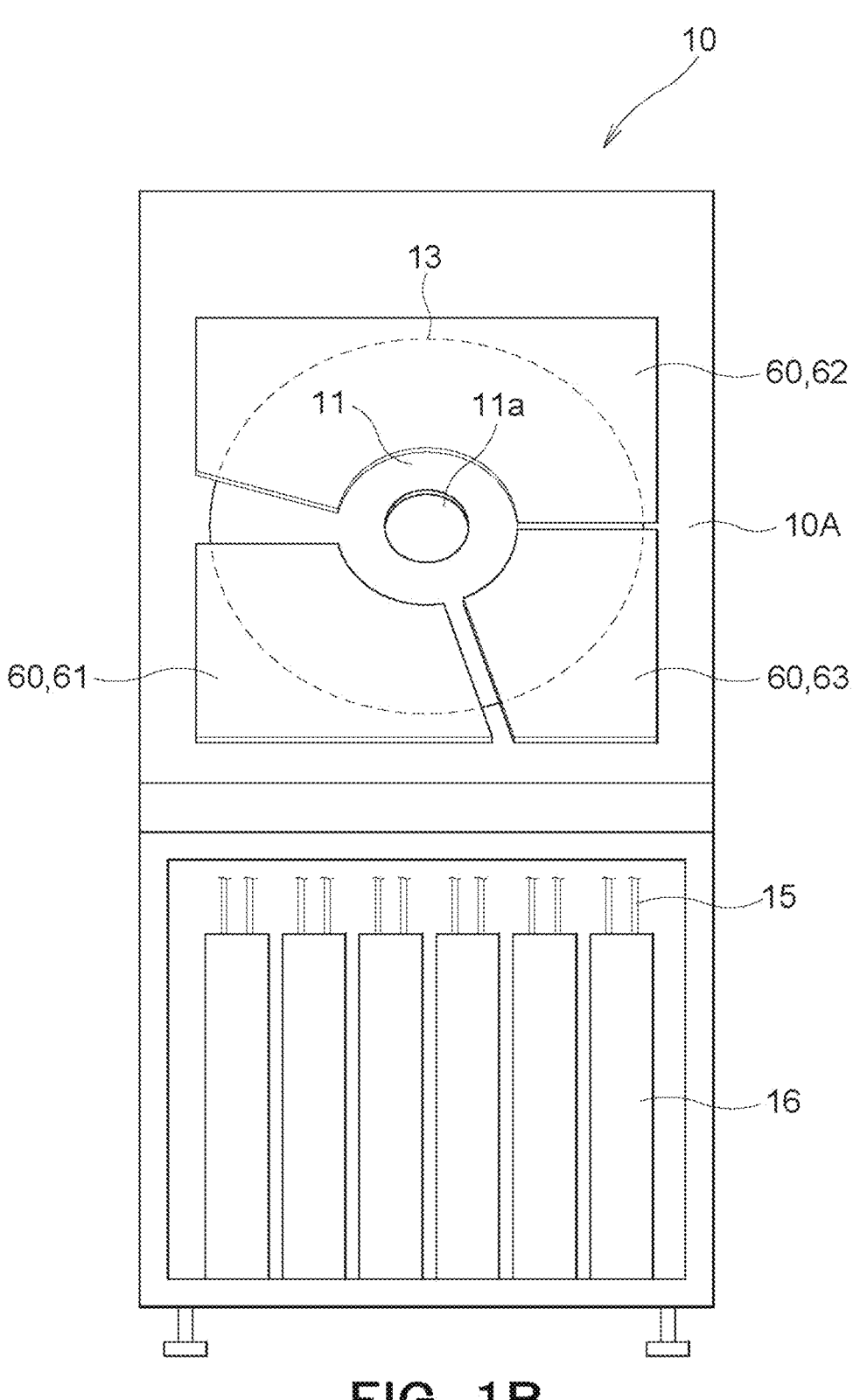
FIG. 1B is a front view of the inspection system shown in FIG. 1A.

FIG. 1A is an oblique perspective view schematically showing an example of an inspection system 10 for electronic components. FIG. 1B is a front view of the inspection system 10 shown in FIG. 1A.

In FIG. 1B, some of the components shown in FIG. 1A (e.g., a supply feeder 18, an electronic component supply unit 19, and a control unit 55) are omitted for ease of understanding.

The inspection system 10 shown in FIGS. 1A and 1B comprises: a structure member 10A; an index table 11 provided with an inclined surface 10a of the structure member 10A; an inspection apparatus 13; an electronic component discharge unit 14; discharge paths 15; and a collection device 16.

The index table 11 has a disk shape, is provided to be able to intermittently rotate around a rotation axis 11a, and has a lot of pockets 12 to accommodate electronic components to be inspected. The numerous pockets 12 form a plurality of lines (e.g., 16 lines) in terms of the radial direction of the index table 11, and in each line a plurality of pockets 12 are arranged at equal angular intervals in the circumferential direction of the index table 11.

The index table 11 is covered by an index table cover 60 from both the front and back sides. The index table cover 60 on the front side includes a first front cover 61, a second front cover 62 and a third front cover 63 that are positioned next to each other via a gap. A lot of electronic components to be inspected are fed from the supply feeder 18 to the electronic component supply unit 19, and are then fed from the electronic component supply unit 19 to pockets 12 via the index table cover 60 (in the example shown in FIGS. 1A and 1B, via the first front cover 61).

The inspection apparatus 13 performs an electrical inspection of an electronic component being accommodated in each pocket 12. The inspection apparatus 13 in the present example can inspect electronic components not only in an environment at room temperature (e.g., 5° C. to 35° C.), but also can perform electrical inspections while actively applying a thermal load (e.g., a thermal load of approximately 100° C. to approximately 170° C.) to each electronic component, as described below. An example of the specific configuration of the inspection apparatus 13 is described below (see FIG. 2).

The electronic component discharge unit 14 discharges electronic components that have already received the electrical inspection performed by the inspection apparatus 13, through the discharge paths 15 to the collection device 16, by using compressed air for example. The collection device 16 has a plurality of collection boxes (in the example shown in FIGS. 1A and 1B, six collection boxes). The electronic component discharge unit 14 sends each electronic component out of a pocket 12 (i.e., the index table 11) to a corresponding collection box according to the result of the electrical inspection. The electronic component discharge unit 14 operates under the control of the control unit 55 in such a manner that electronic components that are determined to be normal as a result of the electrical inspection and electronic components that are determined to have a malfunction are discharged into separate collection boxes.

The electronic component discharge unit 14 may discharge electronic components to separate collection boxes according to the type and/or the degree of malfunctions based on the results of the electrical inspection, and may discharge electronic components to separate collection boxes according to conditions other than the results of the electrical inspection.

According to the inspection system 10 described above, the index table 11 is intermittently rotated in the clockwise direction in FIGS. 1A and 1B in a condition where electronic components to be inspected are stored in respective pockets 12, so that an electronic component W in each pocket 12 is gradually conveyed downstream. An electronic component W in each pocket 12 is subjected to the electrical inspection by the inspection apparatus 13 at the inspection position in the conveyance path, and are then classified and collected by the electronic component discharge unit 14, the discharge paths 15 and the collection device 16 according to the results of said inspection.

The inspection system 10 shown in FIGS. 1A and 1B described above can be realized based on known technology, and further specific descriptions of the configuration of the inspection system 10 are omitted below. As an example, the inspection system 10 of the present embodiment may be configured in a similar manner to the apparatus disclosed in Japanese patent application publication No. 2023-5282.

[Inspection Apparatus]

Figure 2:
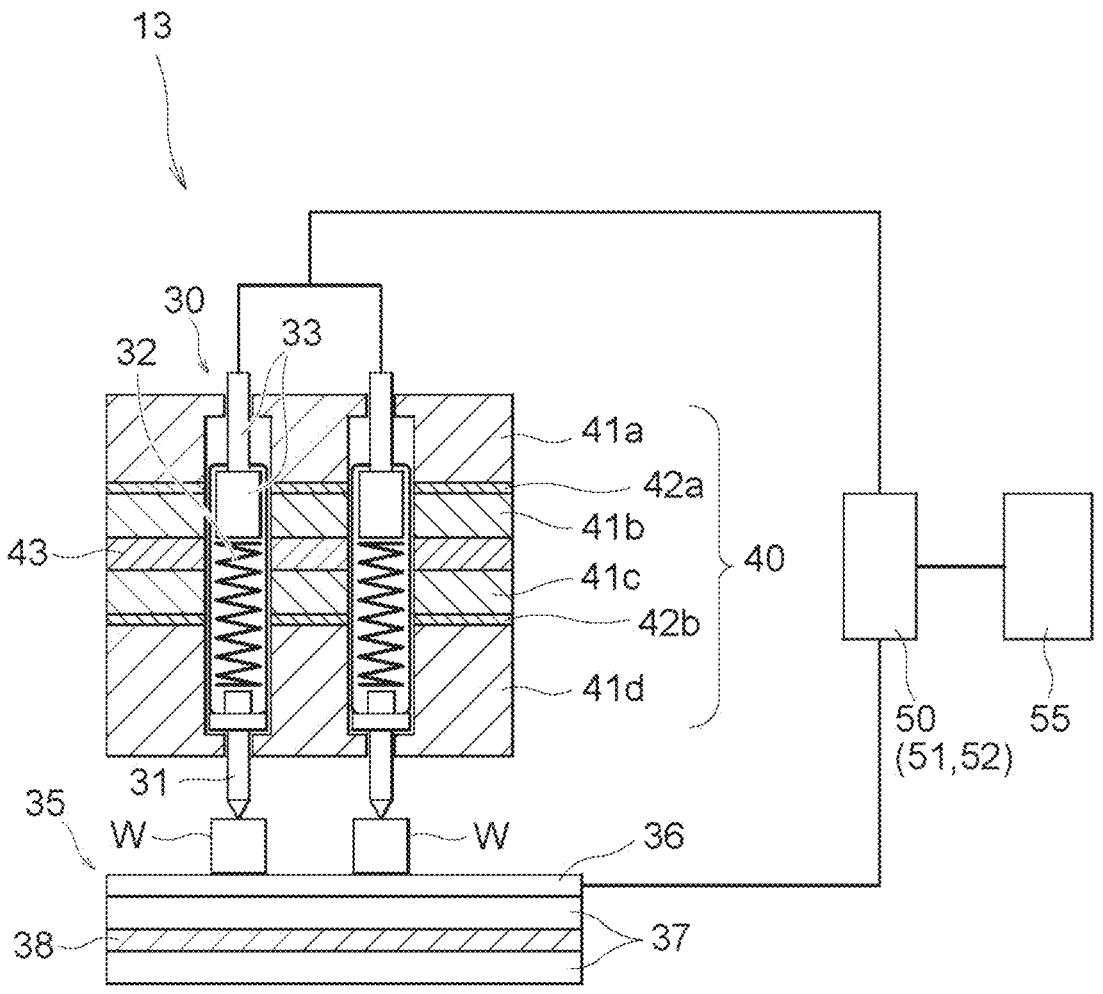
FIG. 2 is a diagram showing the configuration of an example of an inspection apparatus.

FIG. 2 is diagram showing the configuration of an example of the inspection apparatus 13. In FIG. 2, some elements (e.g., a probe holder 40 and an electrode unit 35) are shown in cross-section. Further, although the index table 11 (including the pockets 12) and other parts are omitted in FIG. 2, each electronic component W shown in FIG. 2 is housed in a corresponding pocket 12 and is in a condition where it is intermittently stopped at an inspection position in the middle of conveyance by the index table 11.

The inspection apparatus 13 shown in FIG. 2 comprises a plurality of probe units 30, a probe holder 40, and an electrode unit 35.

The number of probe units 30 is not limited, but the number of probe units 30 corresponding to the number of electronic components W to be inspected simultaneously (e.g., the number of pockets 12 arranged in the radial direction of the index table 11) are provided. Each probe unit 30 has a probe 31, a compression spring 32 and a probe base 33. The probes 31, the compression springs 32 and the probe bases 33 all include electrical conductors having high conductivity, preferably have high thermal conductivity. The probe bases 33 are electrically connected to an electrical circuit 50. The compression springs 32 are each located between a probe 31 and a probe base 33 and are each electrically connected to each of the probe 31 and the probe base 33. Each probe 31 is supported by the probe holder 40 in such a manner that each probe 31 can partially protrude from the probe holder 40 so as to be able to move backward and forward while receiving elastic force from a compression spring 32.

The probe holder 40, which supports each probe unit 30, has a laminated structure that includes a holder bodies 41a, 41b, 41c, 41d, sheet members 42a, 42b and a probe heater 43. The sheet member 42a is provided between the holder body 41a and the holder body 41b, the probe heater 43 is provided between the holder body 41b and the holder body 41c, and the sheet member 42b is provided between the holder body 41c and the holder body 41d.

The holder bodies 41a, 41b, 41c, 41d have a relatively low thermal conductivity and a relatively low electrical conductivity and may be formed by the "Photoveel" material for example. On the other hand, the sheet members 42a, 42b have a relatively high thermal conductivity and a relatively high electrical conductivity and may be formed by a graphite material for example. The probe heater 43 is capable of generating heat under the control of the control unit 55 and may be formed by a rubber heater for example. Heat from the probe heater 43 is efficiently transferred to each probe unit 30 (in particular, each probe 31) through the sheet members 42a, 42b.

The electrode unit 35 has a laminated structure that includes an electrode 36, electrode bases 37 and an electrode heater 38. The electrode 36 is electrically connected to the electrical circuit 50. The electrode bases 37 support the electrode 36. The electrode heater 38 is provided to be covered by the electrode bases 37 on both the front and back sides, is capable of generating heat under the control of the control unit 55, and may be formed by a rubber heater for example. Heat from the electrode heater 38 is transferred to the electrode 36 through an electrode base 37. From the viewpoint of efficiently heating the electrode 36 by the electrode heater 38, an electrode base 37 (in particular, the portion located between the electrode heater 38 and the electrode 36) is preferably formed by a material having excellent heat transfer properties.

The electrical circuit 50 is connected to each probe unit 30 (in the example shown in FIG. 2, each probe base 33) and the electrode 36. While a probe 31 is away from an electronic component W to be inspected, the probe unit 30, the electronic component W, the electrode unit 35 (in particular, the electrode 36) and the electrical circuit 50 is in the state of an open circuit configuration as a whole. On the other hand, when an electronic component W to be inspected is sandwiched by a probe 31 and the electrode 36 in such a manner that the probe 31 and the electrode 36 contact said electronic component W, a closed circuit including the probe unit 30, the electronic component W, the electrode unit 35 (in particular, the electrode 36) and the electric circuit 50 is formed.

The electrical circuit 50 in the present example functions, under the control of the control unit 55, as a voltage applying unit 51 that applies voltage to electronic components W (i.e., capacitors) to perform charging, and also as a current measurement unit 52 that can continuously measure the current of electronic components W (i.e., capacitors) that are being charged. In particular, the electrical circuit 50 (the voltage applying unit 51) provided as part of the inspection system 10 is configured to be capable of providing a relatively large electrical load to electronic components W to be inspected. The magnitude of such an electrical load can be changed by the control unit 55 controlling the electrical circuit 50 (the voltage applying unit 51), and for example, a DC (Direct-Current) voltage of several times (e.g., 2.5 times) the rated voltage of electronic components W may be applied to the electronic components W.

The control unit 55 functions as an anomaly detection unit to detect a malfunction of each electronic component W (in particular, a capacitor) based on the measurement results of the electric circuit 50 (the current measurement unit 52). An example of a specific method of detecting a malfunction of each electronic component W by the control unit 55 is described later.

According to the inspection apparatus 13 described above, while the index table 11 is intermittently stopped, an electronic component W inside each pocket 12 (see FIG. 1A) located at the inspection position is sandwiched between the electrode 36 and a corresponding probe 31. When an electronic component W is sandwiched by the electrode 36 and a probe 31, the electrode unit 35 and/or each probe unit 30 (and thus the probe holder 40) may be moved by a device, which is not shown in the drawings, in such a manner that the electrode 36 and the probe 31 are brought closer to each other from a condition where the electrode 36 and the probe 31 are relatively distanced from each other.

Then, a voltage for inspection is applied to an electronic component W sandwiched by the electrode 36 and a probe 31, by the electric circuit 50 functioning as the voltage applying unit 51, and a small current (a leakage current) flowing in said electronic component W is measured by the electric circuit 50 functioning as the current measurement unit 52. In this manner, the leakage current of electronic components W that are being charged is sequentially measured, and the results of this measurement are sent from the electrical circuit 50 to the control unit 55.

Although the continuous measurement of the leakage current of electronic components W can be performed at any time interval, it is preferable, from the viewpoint of increasing the accuracy of determining whether or not the electronic components W have a malfunction, that the leakage current of electronic components W should be measured continuously at the shortest possible time interval. According to a typical measurement device, the leakage current of electronic components W are usually measured at a time interval of approximately 10 ms (milliseconds) to approximately 100 ms. On the other hand, the inspection system 10 of the present embodiment can perform continuous measurement of the leakage current of electronic components W at time intervals shorter than 10 ms, and for example, by continuously measuring the leakage current of electronic components W at time intervals of 5 ms or less (more preferably, 1 ms or less), it is also possible to accurately detect malfunctions of the electronic components W that are difficult to detect with ordinary measurement devices.

In a case of measuring electrical characteristics (leakage current characteristics) of an electronic component W that is in a condition where the electronic component W is receiving thermal loading, the electrode heater 38 and/or the probe heater 43 are heated to a desired temperature under the control of the control unit 55. This makes it possible that the electrode 36 and/or the probes 31 are heated, and while the electrode 36 and the probes 31 are in contact with electronic components W, heating of the electronic components W (i.e., the application of thermal load to the electronic components W) can be performed along with the voltage application and the leakage current measurement with respect to the electronic components W.

The control unit 55 determines whether or not each electronic component W has a malfunction based on the measurement results of the leakage current of each electronic component W provided by the electric circuit 50.

[Inspection Method]

Figure 3:
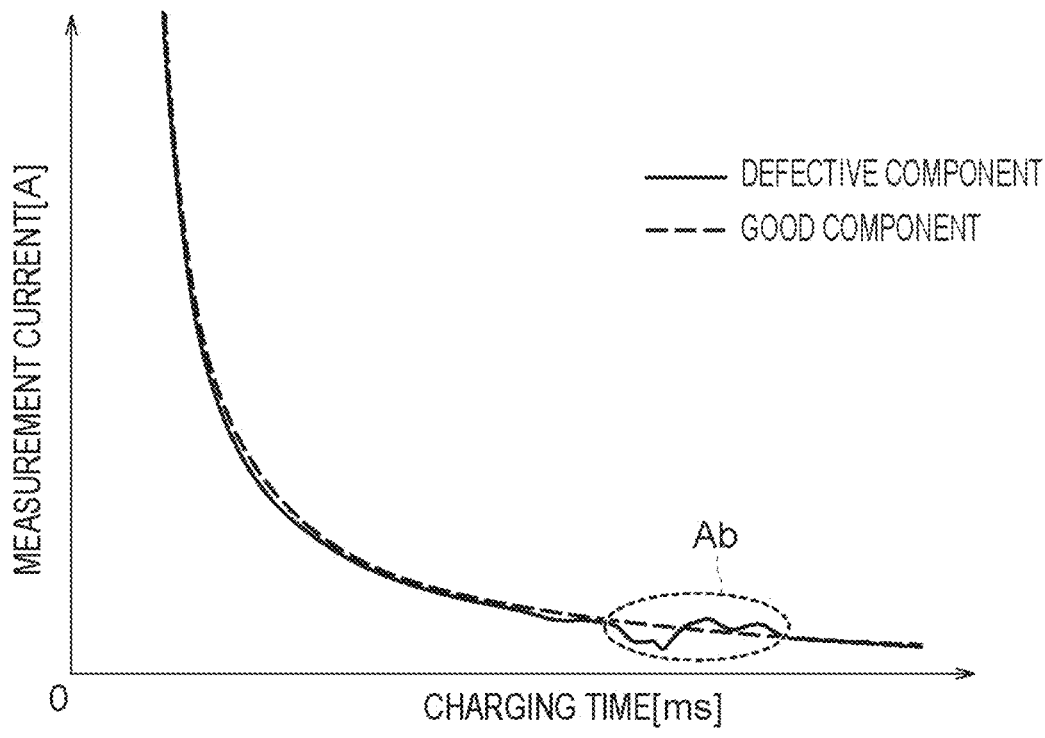
FIG. 3 is a graph (an antilogarithm graph) showing an example of measurement results of leakage current of electronic components (i.e., capacitors)

FIG. 3 is a graph (an antilogarithm graph) showing an example of measurement results of the leakage current of electronic components W (i.e., capacitors). The X-axis in FIG. 3 shows the charging time (milliseconds (ms)), which is the time elapsed from the start of measurement (the origin (0)), and the Y-axis shows the measured values of the leakage current of electronic components W (amperes (A)).

FIG. 3 shows the measurement results of the leakage current of a normal electronic component (i.e., a "good component") that contains no abnormalities and the measurement results of the leakage current of an electronic component having an anomaly (i.e., a "defective component") in a case where the electronic components W (i.e., capacitors) are charged by applying a constant DC voltage.

The inventors of the present case have newly discovered, as a result that the inventors had continued to conduct their studies on the behavior of electrical characteristics (in particular, the leakage current characteristics) of capacitors (e.g., MLCCs) during charging, the fact that capacitors sometimes exhibit temporary abnormal behavior during charging (see the reference code of "Ab" in FIG. 3).

Such abnormal behavior can be ascertained by changes in the measured leakage current of a capacitor, but such abnormal behavior is not always constant and the amount of change may be small. Further, the inventors have newly discovered that there are some capacitors that return to normal behavior after exhibiting abnormal behavior for a certain period of time (e.g., tens of milliseconds to several seconds) and that thereafter behave like good capacitors.

A conventional inspection apparatus that detects capacitor abnormalities based on the measured peak value of the leakage current, is suitable for determining faults which causes the leakage current to increase in an unexpected timing, but is not necessarily suitable for determining faults which causes the leakage current to decrease. Further, conventional inspection apparatuses cannot always address in a sufficient manner capacitors that do not have deteriorated insulation but have anomalies that cause unstable leakage current for some reason.

Furthermore, the larger capacity of MLCCs have made progress in recent years, but the ceramic layers of MLCCs tend to become thinner as the capacity increases, making it difficult to apply a high voltage to MLCCs for screening inspections. Therefore, there is a need for a technology to achieve reliable screening inspections while keeping the applied voltage to MLCCs (capacitors) low.

For example, the device of Japanese patent application publication No. 9-152455 detects steep pulse-like abnormal currents (i.e., leakage currents) that occur in capacitors during charging. Although the device of Japanese patent application publication No. 9-152455 is effective when the leakage current during charging shows stable behavior, it is difficult for the device of Japanese patent application publication No. 9-152455 to reliably detect abnormal currents when the leakage current changes relatively rapidly per unit of time. Further, the device of Japanese patent application publication No. 9-152455 is unable to detect anomalies that cause the leakage current of a capacitor to decline.

Further, the device of Japanese patent application publication No. 2000-228337 determines whether a capacitor is good or bad based on whether the evaluation function that is determined from the capacitor's actual measurement current value and the standard screening current value, draws a curve protruding with respect to either the top or bottom. However, as also described in Japanese patent application publication No. 2000-228337 (see paragraph 0012), the device of Japanese patent application publication No. 2000-228337 treats temporary changes in the actual measurement current value of a capacitor as noise and does not detect them as abnormalities. Further, the device of Japanese patent application publication No. 2000-228337 is unable to detect anomalies that cause the leakage current of a capacitor to decline.

The inventors of the present case have discovered, as a result that the inventors had continued to conduct their studies in light of the above-mentioned knowledges, a new technology that can effectively and accurately detect even capacitor abnormalities that cannot be detected by conventional devices. Specifically, a new method has been found to accurately detect capacitor abnormalities based on a regression line derived from the logarithm of the measurement values of the current (leakage current) of an electronic component W (a capacitor) in the determination time range during charging of the electronic component W (the capacitor) and the logarithm of the measurement timing of said current. According to this method, it is possible to detect with high accuracy abnormal behavior that a capacitor having an anomaly temporarily exhibits during charging. In particular, even if the amount of change in the abnormal behavior is small or even if the abnormal behavior lasts only a limited time (e.g., tens of milliseconds to several seconds), such abnormal behavior can be detected with high accuracy.

Although there are many possible variations of such an anomaly detection method, all of them can detect abnormal behavior of a capacitor based on a regression line. A typical example of such an anomaly detection method is shown below; however, anomaly detection methods that utilize regression lines in a form different from the typical example described below are also included in the contents of the present disclosure.

[First Anomaly Detection Method]

Figure 4:
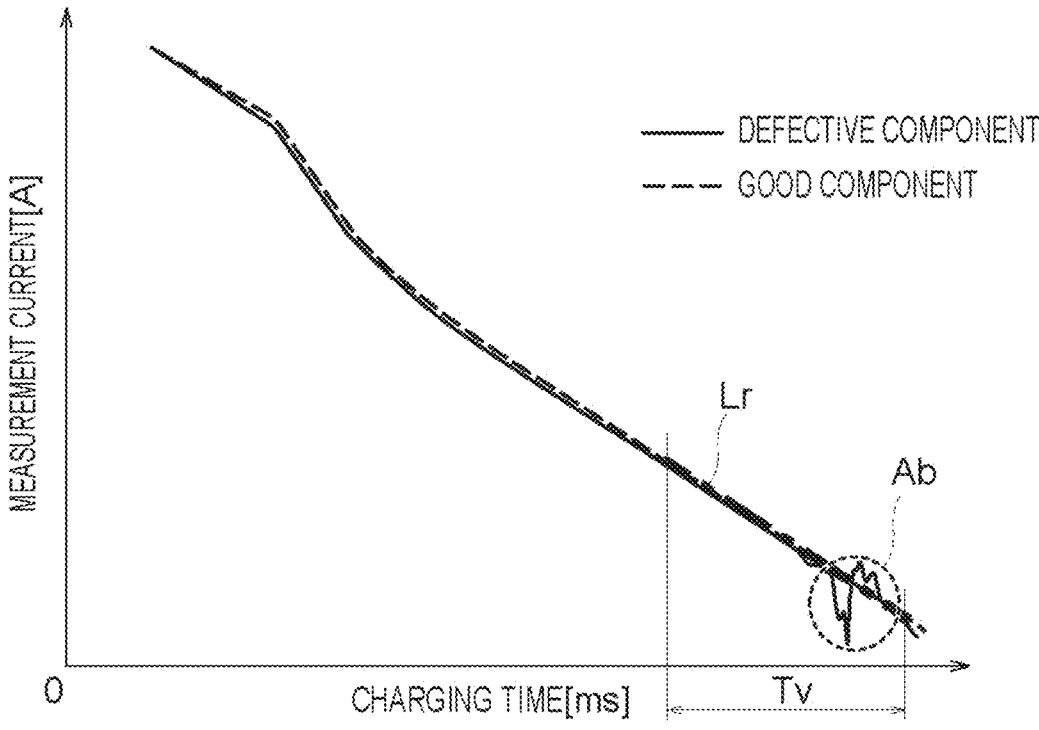
FIG. 4 is a graph (i.e., a double logarithm graph) that shows an example of measurement results of leakage current of electronic components (i.e., capacitors), for a graph for explaining a first anomaly detection method.

FIG. 4 is a graph (i.e., a double logarithm graph) that shows an example of measurement results of the leakage current of electronic components W, for a graph for explaining a first anomaly detection method. The X and Y axes in FIG. 4 are based on a logarithmic scale, the X axis in FIG. 4 shows the charging time (milliseconds), which is the time elapsed from the start of measurement (the origin (0)) using a logarithm, and the Y axis shows measurement values (amperes) of the leakage current of electronic components W using a logarithm.

FIG. 4 shows measurement results of the leakage current of a normal electronic component that contains no abnormalities (i.e., a "good component") and measurement results of the leakage current of an electronic component with an anomaly (i.e., a "defective component") when a constant DC voltage was applied to the electronic components W (capacitors) for charging. Further, in FIG. 4, a "regression line Lr" obtained based on the least-squares method from the measurement results of the good component and the defective component is shown. According to the inspection method based on the first anomaly detection method, a charging step, a current measurement step and an anomaly detection step are performed under the control of the control unit 55.

In the charging step, a voltage is applied to an electronic component W (a capacitor) by the electric circuit 50 (the voltage applying unit 51) in a condition where the electronic component W is sandwiched by a probe 31 and the electrode 36 shown in FIG. 2 in such a manner that the charging of the electronic component W is performed. In the current measurement step, the current of an electronic component W (the leakage current of a capacitor) that is being charged is continuously measured by the electric circuit 50 (the current measurement unit 52). In this manner, the current measurement step and the charging step are performed in parallel.

Then, in the anomaly detection step, the control unit 55 (the anomaly detection unit) detects an anomaly of an electronic component W (a capacitor) based on a regression line Lr derived from the logarithm of measured values of the leakage current in a determination time range Tv during charging and the logarithm of measurement timing of the leakage current. More specifically, the control unit 55 detects an anomaly of an electronic component W based on the degree of the agreement of the logarithm of the measurement timing and the logarithm of the measured values of the leakage current with respect to the regression line Lr.

The "determination time range Tv" here is a time range suitable for determining whether or not an electronic component W has an anomaly, and more specifically, is set to a time range where the degree of the agreement of the measurement results of a good component with respect to the regression line Lr is high. The optimal determination time range Tv is determined under the influence of the leakage current characteristics of an electronic component W and/or the applied voltage to an electronic component W, and may be set in the time range of 200 ms to 1500 ms after the start of charging (see the origin "0" in FIG. 4) as an example.

The "degree of the agreement of the logarithm of the measurement timing and the logarithm of the measured values of the leakage current with respect to the regression line Lr" is typically calculated as a coefficient of determination based on the least-squares method. The specific method of calculating the coefficient of determination is not limited, and the coefficient of determination can be calculated using a known arithmetic formula.

For example, if an electronic component W is a good component, the "degree of the agreement of the logarithm of the measurement timing and the logarithm of the measured values of the leakage current with respect to the regression line Lr" is relatively high, and the value of the coefficient of determination (a contribution ratio) based on the least-squares method is also relatively high. If the coefficient of determination for a case in which the logarithm of the measured value of the leakage current and the logarithm of the timing of measurement coincide perfectly with the regression line Lr is expressed as "100%", the coefficient of determination for a good electronic component W may indicate, for example, 95.0% or more (as an example, 99.0% or more).

On the other hand, if an electronic component W is a defective component, the "degree of the agreement of the logarithm of the measurement timing and the logarithm of the measured values of the leakage current with respect to the regression line Lr" is relatively low, and the value of the determination coefficient is also relatively low and may indicate a value smaller than 95.0% (as an example, a value smaller than 99.0%) for example.

Although electronic components W to be inspected can be classified as good components or defective components based on the determination coefficient as described above, the threshold value of the determination coefficient that serves as the classification criteria for good components and defective components, is set appropriately according to the actual tolerance of abnormalities. In other words, the closer the threshold value is to "100%," the stricter the determination of the presence or absence of an anomaly becomes and even minor abnormalities are not tolerated, and consequently the tendency to increase the percentage of electronic components W determined to be defective components is created.

Therefore, the higher the requirement for reliability of the normality of the electrical characteristics (leakage current characteristics) of electronic components W, the closer to "100%" is set the threshold value of the determination coefficient that serves as the classification criteria for good components and defective components. To meet the high level of reliability required by recent advanced technologies, the threshold value of the determination coefficient may be required to be set to "99.0%" or higher, for example.

In this manner, the "degree of the agreement of the logarithm of the measurement timing and the logarithm of the measured values of the leakage current with respect to the regression line Lr" represents the linearity of the logarithm of the measured values of the leakage current and the logarithm of the measurement timing, and can be expressed as a coefficient of determination based on the least-squares method. However, the "degree of the agreement of the logarithm of the measurement timing and the logarithm of the measured values of the leakage current with respect to the regression line Lr" may be obtained based on any other method that can directly or indirectly evaluate the linearity on a double logarithm graph of the "CHARGING TIME-MEASUREMENT CURRENT".

For example, the control unit 55 (the anomaly detection unit) may determine the "degree of the discrepancy" of the logarithm of the measured values of the leakage current and the logarithm of the measurement timing with respect to the regression line Lr using any method, and may detect an anomaly of an electronic component W based on the degree of the discrepancy. Further, the control unit 55 (the anomaly detection unit) may extract the data of the measured values of the leakage current of an electronic component W to be inspected only for a part of the time range (the determination time range Tv) during the charging time. In this case, the control unit 55 may detect an anomaly of an electronic component W based on the regression line Lr derived from the logarithm of the measured values of the extracted leakage current and the logarithm of the measurement timing of said leakage current.

The control unit 55 controls the electronic component discharge unit 14 based on the results of the inspection including the series of steps described above to discharge electronic components W that are determined to have an anomaly and electronic components W that are not determined to have an anomaly into separate collection boxes of the collection device 16 via the discharge paths 15.

[Second Anomaly Detection Method]

In the following description about a second anomaly detection method, detailed descriptions are omitted for processes similar to the first anomaly detection method described above (see FIG. 4).

Figure 5:
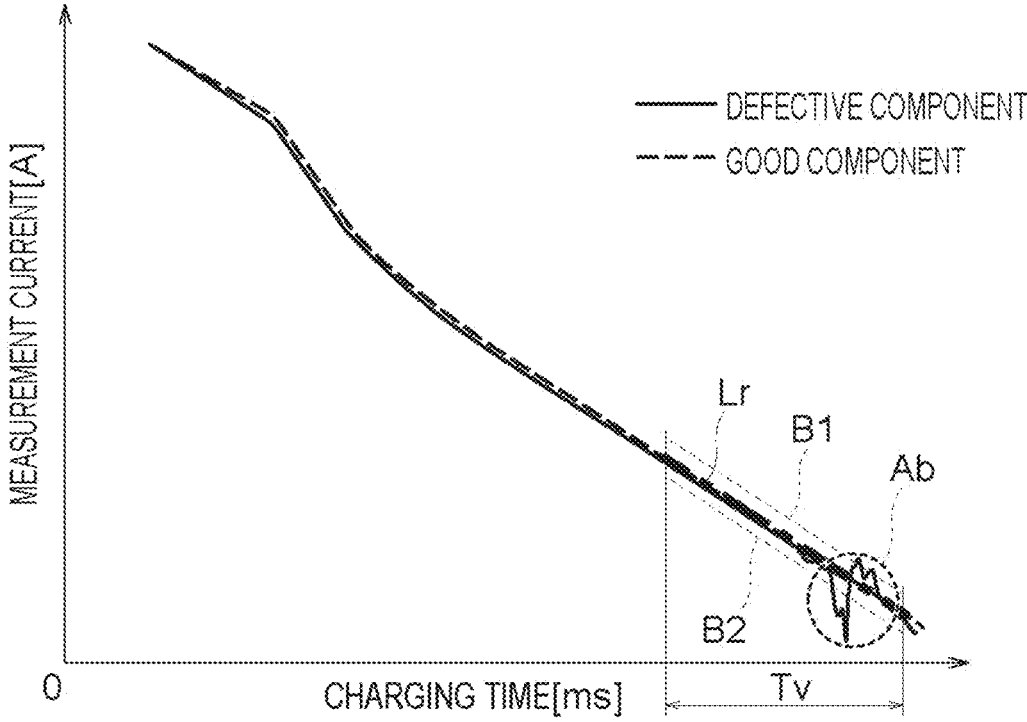
FIG. 5 is a graph (i.e., a double logarithm graph) that shows an example of measurement results of leakage current of electronic components (i.e., capacitors), for explaining a second anomaly detection method.

FIG. 5 is a graph (i.e., a double logarithm graph) that shows an example of measurement results of the leakage current of electronic components W, for explaining a second anomaly detection method. The X and Y axes in FIG. 5 are represented by logarithmic scales, the X axis in FIG. 5 shows the logarithm of the charging time (milliseconds), which is the time elapsed from the start of measurement (origin (0)), and the Y axis shows the logarithm of the measured values (amperes) of the leakage current of electronic components W.

FIG. 5 shows the measurement results of an electronic component being a good component and the measurement results of an electronic component being a defective component, as well as the regression line Lr obtained based on the measurement results of the good component and the defective component. In addition, FIG. 5 shows the upper limit B1 and the lower limit B2 of the current tolerance range.

Also in the inspection method based on the second anomaly detection method, a charging step, a current measurement step and an anomaly detection step are performed, and in particular, the charging step and the current measurement step are performed in a similar manner to those in the inspection method based on the first anomaly detection method described above.

However, in the anomaly detection step based on the second anomaly detection method, the control unit 55 (the anomaly detection unit) determines whether or not the logarithm of the measured values of the leakage current of an electronic component W in the determination time range Tv is included within the current tolerance range defined based on the regression line Lr. In other words, an anomaly of an electronic component W (a capacitor) is detected based on the relation of the logarithm of the measured values of the leakage current with respect to at least one of the upper limit B1 and the lower limit B2 of the current tolerance range which are defined based on the regression line Lr over the determination time range Tv.

In the logarithmic graph in FIG. 5, the area between the line indicated by the reference sign "B1" (i.e., the upper limit) and the line indicated by the reference sign "B2" (i.e., the lower limit) corresponds to the current tolerance range, and the regression line Lr exists in this area (i.e., the current tolerance range) in the determination time range TV.

As described above, electronic components W to be inspected can be classified as good components or defective components based on the current tolerance range (the upper limit B1 and the lower limit B2), and the upper limit B1 and the lower limit B2 that define the current tolerance range correspond to threshold values that serve as classification criteria for good components and defective components and are appropriately set according to the actual tolerance of abnormalities. In other words, the closer the values of the upper limit B1 and the lower limit B2 of the current tolerance range are to the regression line Lr, the stricter the determination of the presence or absence of an anomaly becomes, the less acceptable even minor anomalies become, and the greater the percentage of electronic components W determined to be defective. Therefore, the higher the demand for reliability of the normality of the electrical characteristics (leakage current characteristics) of electronic components W becomes, the closer to the regression line Lr the values are set as the upper limit B1 and the lower limit B2 of the current tolerance range, which are the classification criteria for good and defective components.

The specific method of determining the upper limit B1 and the lower limit B2 of the current tolerance range is not limited. For example, between the upper limit B1 and the lower limit B2 of the current tolerance range, the differences from the regression line Lr regarding the measurement current (see Y-axis in FIG. 5) may be the same value or different values. Further, the difference with respect to the measurement current between the regression line Lr and the upper limit B1 or the lower limit B2 of the current tolerance range may be the same or may not be the same over the entire determination time range Tv. Therefore, in a double logarithm graph of "CHARGING TIME-MEASUREMENT CURRENT" (see FIG. 5), the line indicating the upper limit B1 of the current tolerance range and the line indicating the lower limit B2 of the current tolerance range may be parallel or non-parallel to the regression line Lr.

Further, the upper limit B1 and the lower limit B2 of the current tolerance range may be determined from the values of the regression line Lr (Y-axis values with respect to the measurement current) at multiple discrete time timings selected from the determination time range Tv. For example, the upper limit B1 and the lower limit B2 of the current tolerance range may be defined based on the regression line Lr with respect to the two points of the "start time timing (start point)" and the "end time timing (end point)" of the determination time range Tv. In this case, the upper limit B1 of the current tolerance range over the entire determination time range Tv may be defined by a straight line passing through these two points (i.e., the start point and the end point) regarding the upper limit B1 of the current tolerance range in a double logarithmic graph of "CHARGING TIME- MEASUREMENT CURRENT" (see FIG. 5). Similarly, the lower limit B2 of the current tolerance range over the entire determination time range Tv may be defined by a straight line passing through these two points (the start point and the end point) regarding the lower limit B2 of the current tolerance range in a double logarithm graph of "CHARGING TIME-MEASUREMENT CURRENT".

Further, the control unit 55 (the anomaly detection unit) may set only one of the upper limit B1 and the lower limit B2 of the current tolerance range to a value different from the regression line Lr. In this case, the other of the upper limit B1 and the lower limit B2 of the current tolerance range may be set the same value as the regression line Lr.

In the anomaly detection step described above, if the entire measurement current of an electronic component W in the determination time range Tv is within the current tolerance range (including, for example, the boundaries (the upper limit B1 and the lower limit B2)), the control unit 55 can determine that there is no anomaly in the electronic component W. On the other hand, if at least a part of the measurement current of an electronic component W in the determination time range Tv is in a range outside the current tolerance range (which does not include, for example, the boundaries (the upper limit B1 and the lower limit B2) of the current tolerance range), the electronic component W can be determined to have an anomaly.

Then, the control unit 55 controls the electronic component discharge unit 14 based on the results of the inspection including the series of steps described above in such a manner that the electronic components W that are determined to have an anomaly and the electronic components W that are not determined to have an anomaly are discharged into separate collection boxes of the collection device 16 via the discharge paths 15.

[Examples of Application of Anomaly Detection Methods]

The first anomaly detection method and the second anomaly detection method described above (see FIGS. 4 and 5) or other detection methods based on the regression line Lr can be applied to a method of inspecting electronic components W as follows to accurately detect anomalies in electronic components W.

[Application 1]

Figure 6:
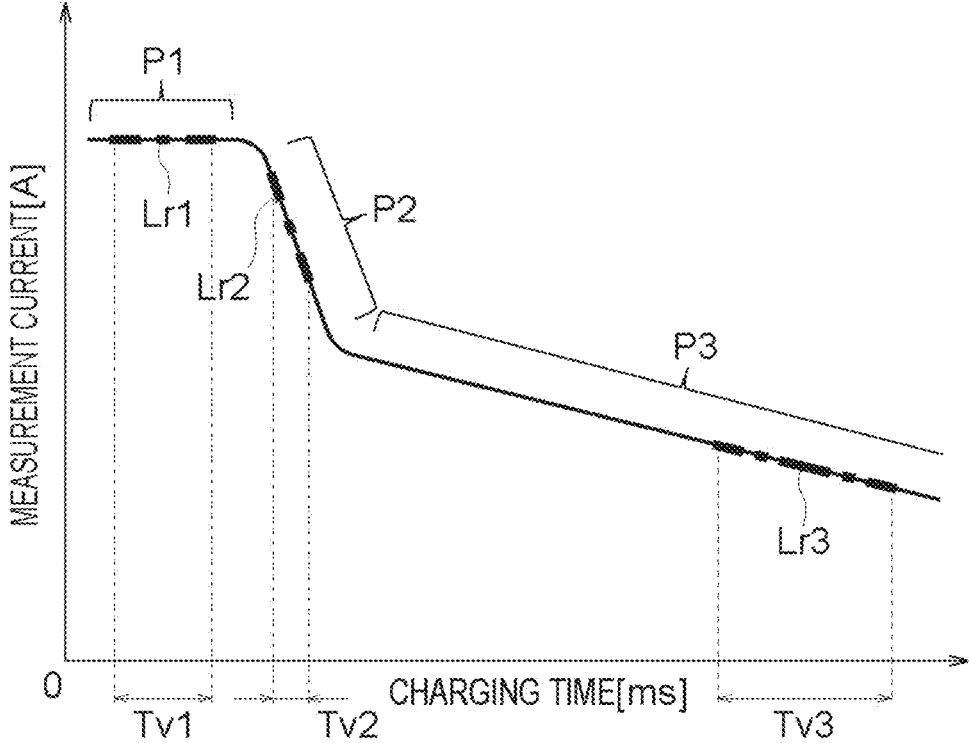
FIG. 6 is a double-logarithmic graph of "CHARGING TIME-MEASUREMENT CURRENT" that shows an example of the general electrical characteristics of a capacitor.

FIG. 6 is a double-logarithmic graph of "CHARGING TIME-MEASUREMENT CURRENT" that shows an example of the general electrical characteristics of a capacitor.

The correlation between the logarithm of the charging time of a capacitor and the logarithm of the leakage current of the capacitor when a constant DC voltage is applied to the capacitor for charging is not necessarily constant over the entire charging time, and there may be multiple phases (see "P1" to "P3" in FIG. 6) that exhibit inherent linearities (proportional relations). In the example shown in FIG. 6, there is a first phase P1 in which the leakage current of a capacitor is almost constant, a second phase P2 in which the leakage current decreases rapidly, and a third phase P3 in which the leakage current decreases more rapidly than the first phase P1 but more slowly than the second phase P2. In double logarithm graph shown in FIG. 6, the "CHARGING TIME-MEASUREMENT CURRENT" shows a proportional correlation in all of the phases P1 to P3, but the ratio of the proportional correlation of "CHARGING TIME-MEASUREMENT CURRENT" (i.e., the slope of linearity) differs between the first phase P1, the second phase P2 and the third phase P3.

The control unit 55 (the anomaly detection unit) can set the determination time range Tv and regression line Lr with respect to each of the phases in such a manner that an anomaly of an electronic component W (i.e., a capacitor) can be detected in each phase.

Specifically, the control unit 55 can detect an anomaly of an electronic component W in a first determination time range during charging based on a first regression line derived from the logarithm of measured values of the leakage current of the electronic component W in the first determination time range and the logarithm of the measurement timing of said leakage current. On the other hand, the control unit 55 can detect an anomaly of an electronic component W in a second determination time range during charging based on a second regression line derived from the logarithm of measured values of the leakage current of the electronic component W in the second determination time range and the logarithm of the measurement timing of said leakage current.

By setting the "first determination time range" and the "second determination time range" here to different phases from each other (see the first phase P1, the second phase P2 and the third phase P3 in FIG. 6), anomalies of electronic components W can be detected at each of the multiple phases. If there are three or more phases in the correlation between the charging time and the leakage current of a capacitor, three or more determination time ranges may be set to be assigned to the respective phases.

For example, in the example shown in FIG. 6, a "first determination time range Tv1" may be set in the first phase P1, a "second determination time range Tv2" may be set in the second phase P2, and a "third determination time range Tv3" may be set in the third phase P3. In this case, a first regression line Lr1 is determined based on measurement results of the leakage current in the first determination time range Tv1, a second regression line Lr2 is determined based on measurement results of the leakage current in the second determination time range Tv2, and a third regression line Lr3 is determined based on measurement results of the leakage current in the third determination time range Tv3. Then, using the above-mentioned anomaly detection methods (see FIG. 4 and FIG. 5), an anomaly of an electronic component W in the first determination time range Tv1 can be detected based on the first regression line Lr1, an anomaly of an electronic component W in the second determination time range Tv2 can be detected based on the second regression line Lr2, and an anomaly of an electronic component W in the third determination time range Tv3 can be detected based on the third regression line Lr3.

The "first determination time range" and the "second determination time range" may be set in a common phase. For example, in a certain one phase that occupies a relatively long time range (see the third phase P3 in FIG. 6), a "first determination time range" and a "second determination time range" (and a third and subsequent determination time ranges) may be set.

[Application 2]

The inspection apparatus 13 may perform an inspection(s) multiple times on each electronic component W. Such multiple-time electrical inspections may include two-time electrical inspections in which the polarities (the orientation of the positive pole and the negative pole) of the current (DC current) when applying voltage for inspection to each electronic component W are different from each other.

Specifically, the electric circuit 50 (the voltage applying unit 51; see FIG. 2) may perform a first polarity charging by applying a voltage to an electronic component W (a capacitor) in a first polarity, and after the first polarity charging, perform a second polarity charging by applying a voltage to the electronic component W in a second polarity that is the opposite polarity to the first polarity. In this case, the electric circuit 50 (the current measurement unit 52) measures a first polarity current, which is the leakage current of the electronic component W during the first polarity charge, and a second polarity current, which is the leakage current of the electronic component W during the second polarity charge. Then, the control unit 55 (the anomaly detection unit) can detect an anomaly in the electronic component W (capacitor) based on a first polarity regression line derived from the logarithm of the measured values of the first polarity current in the first determination time range during first polarity charging and the logarithm of the measurement timing of the first polarity current. Similarly, the control unit 55 can detect an anomaly in the electronic component W (capacitor) based on a second polarity regression line derived from the logarithm of the measured values of the second polarity current in the second determination time range during the second polarity charging and the logarithm of the measurement timing of the second polarity current. When a negative voltage is applied to an electronic component W (e.g., in a case of the second polarity charging), the measured values of the leakage current (e.g., the second polarity current) of electronic component W are also negative values, and therefore, the regression line may be derived from the logarithm of the absolute values of the measured values of the leakage current.

Capacitors of electronic components W may exhibit peculiar electrical characteristics depending on the polarity of the applied current, and may show abnormal behavior of the leakage current only one of when subjected to voltage application of the first polarity and when subjected to voltage application of the second polarity. Even if an electronic component W to be inspected has such characteristics, an anomaly of the electronic component W can be reliably detected by performing electrical inspection with respect to each of the first polarity and the second polarity as in the present application example.

As explained above, according to the inspection apparatuses 13 and the inspection methods described above, anomalies of electronic components W (capacitors) can be detected based on the regression line Lr derived from the logarithm of measured values of the leakage current of the electronic components W in the determination time range Tv during charging and the logarithm of the measurement timing of said leakage current.

In particular, even if an electronic component W with an anomaly shows an abnormal behavior only for a temporary period of time during charging, the inspection apparatuses 13 and the inspection methods described above can appropriately detect an anomaly of such an electronic component W. Further, even if the behavior of the leakage current of an electronic component W is not constant and the amount of change in said leakage current is small, the inspection apparatuses 13 and the inspection methods described above can appropriately detect an anomaly of such an electronic component W.

Further, according to the inspection apparatuses 13 and the inspection methods described above, it is possible to detect not only an anomaly which causes the leakage current of an electronic component W to increase, but also an anomaly which causes said leakage current to decrease. Further, even if the voltage for inspection applied to an electronic component W to be inspected is low, an anomaly of an electronic component W can be reliably detected.

Further, electronic components W whose leakage current per unit time fluctuates relatively violently even in normal conditions may be used as inspection targets, and the above-mentioned second anomaly detection method (see FIG. 5) makes it possible to detect anomalies of such electronic components W with high accuracy. In other words, by determining the upper limit B1 and/or the lower limit B2 of the current tolerance range in consideration of the magnitude of the fluctuation of the leakage current in the normal state of an electronic component W, it is possible to detect a true "anomaly" of an electronic component W while preventing the fluctuation of the leakage current in the normal state from being detected as an "anomaly". Further, according to such a second anomaly detection method, it is also possible to detect "an anomaly which causes the leakage current to be not stable for some reason although the insulation properties of an electronic component W (a capacitor) are not deteriorated".

It should be noted that the embodiments and variations disclosed in the present specification are in all respects illustrative only and are not to be construed as limiting. The above-described embodiments and variations may be omitted, substituted and modified in various forms without departing from the appended claims and the intention of the appended claims. For example, the above-mentioned embodiments and variations may be combined in whole or in part, and embodiments other than those described above may be combined with the above-described embodiments or the above-described variations. Further, the effects of the present disclosure described in the present specification are illustrative only, and other effects may be brought about.

The technical categories embodying the technical ideas described above are not limited. For example, the above-described technical ideas may be embodied by a computer program for having a computer execute one or more processes (steps) included in a method of manufacturing or using the devices described above. Further, the above technical ideas may also be embodied by a computer-readable non-transitory recording medium in which such a computer program is recorded.

The invention claimed is:

1. An inspection apparatus comprising:
a voltage application unit that applies voltage to a capacitor to perform charging;
a current measurement unit that continuously measures current of the capacitor during the charging; and
a computer processor that detects an anomaly of the capacitor based on a regression line derived from a logarithm of a measured value of the current in a determination time range during the charging and a logarithm of measurement timing of the current.

2. The inspection apparatus as defined in claim 1, wherein the computer processor detects an anomaly of the capacitor based on degree of agreement of the logarithm of a measured value of the current and the logarithm of measurement timing of the current with respect to the regression line.

3. The inspection apparatus as defined in claim 1, wherein the computer processor detects an anomaly of the capacitor based on a relation of the logarithm of a measured value of the current with respect to at least one of an upper limit and a lower limit of a current tolerance range defined according to the regression line over the determination time range.

4. The inspection apparatus as defined in claim 1, wherein the computer processor
detects an anomaly of the capacitor based on a first regression line derived from the logarithm of a measured value of the current and the logarithm of measurement timing of the current in a first determination time range during the charging, and
detects an anomaly of the capacitor based on a second regression line derived from the logarithm of a measured value of the current and the logarithm of measurement timing of the current in a second determination time range during the charging.

5. The inspection apparatus as defined in claim 1, wherein:
the voltage application unit
applies voltage to the capacitor in a first polarity to perform first polarity charging, and
applies voltage to the capacitor in a second polarity being an opposite polarity to the first polarity, after the first polarity charging to perform second polarity charging;
the current measurement unit
measures a first polarity current that is a current of the capacitor during the first polarity charging, and
measures a second polarity current that is a current of the capacitor during the second polarity charging; and
the computer processor
detects an anomaly of the capacitor based on a first polarity regression line derived from a logarithm of a measured value of the first polarity current in a first determination time range during the first polarity charging and a logarithm of measurement timing of the first polarity current, and
detects an anomaly of the capacitor based on a second polarity regression line derived from a logarithm of a measured value of the second polarity current in a second determination time range during the second polarity charging and a logarithm of measurement timing of the second polarity current.

6. An inspection method comprising the steps of:
applying voltage to a capacitor to perform charging;
measuring current of the capacitor continuously during the charging;
detecting an anomaly of the capacitor based on a regression line derived from a logarithm of a measured value of the current and a logarithm of measurement timing of the current in a determination time range during the charging; and
separately discharging electronic components determined to have the anomaly and electronic components determined not to have an anomaly to the collection device via discharge paths.

* * * * *